(12) United States Patent
Huang et al.

(10) Patent No.: US 11,855,126 B2
(45) Date of Patent: *Dec. 26, 2023

(54) SEMICONDUCTOR DEVICE INCLUDING METAL INSULATOR METAL CAPACITOR AND METHOD OF MAKING

(71) Applicant: TAIWAN SEMICONDUCTOR MANUFACTURING COMPANY, LTD., Hsinchu (TW)

(72) Inventors: Yan-Jhih Huang, Hsinchu (TW); Chun-Yuan Hsu, Hsinchu (TW); Chien-Chung Chen, Hsinchu (TW); Yung-Hsieh Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/534,431

(22) Filed: Nov. 23, 2021

(65) Prior Publication Data
US 2022/0085148 A1 Mar. 17, 2022

Related U.S. Application Data

(60) Continuation of application No. 16/780,686, filed on Feb. 3, 2020, now Pat. No. 11,201,206, which is a division of application No. 14/103,651, filed on Dec. 11, 2013, now Pat. No. 10,553,672.

(51) Int. Cl.
*H01L 23/522* (2006.01)
*H01L 27/02* (2006.01)
*H01L 49/02* (2006.01)
*H01L 21/28* (2006.01)
*H10B 41/30* (2023.01)

(52) U.S. Cl.
CPC .......... *H01L 28/60* (2013.01); *H01L 23/5223* (2013.01); *H01L 28/87* (2013.01); *H01L 23/5222* (2013.01); *H01L 27/0207* (2013.01); *H01L 28/40* (2013.01); *H01L 29/40114* (2019.08); *H01L 2924/00* (2013.01); *H01L 2924/0002* (2013.01); *H10B 41/30* (2023.02)

(58) Field of Classification Search
CPC ..... H01L 28/60; H01L 23/5223; H01L 28/87; H01L 23/5222; H01L 27/0207; H01L 28/40; H01L 2924/00; H01L 2924/0002; H01L 29/40114; H10B 41/30
See application file for complete search history.

(56) References Cited

U.S. PATENT DOCUMENTS

| | | |
|---|---|---|
| 6,042,996 A | 3/2000 | Lin |
| 11,201,206 B2 * | 12/2021 | Huang ................ H01L 23/5223 |
| 2001/0020713 A1 | 9/2001 | Yoshitomi |
| 2010/0084739 A1 | 4/2010 | Matsui |

(Continued)

*Primary Examiner* — Patricia D Valenzuela
(74) *Attorney, Agent, or Firm* — Hauptman Ham, LLP

(57) ABSTRACT

A semiconductor device includes a substrate. The semiconductor device further includes a circuit layer over the substrate. The semiconductor device further includes a test line electrically connected to the circuit layer. The semiconductor device further includes a capacitor on the substrate. The capacitor includes a first conductor, wherein the first conductor is on a portion of the substrate exposed by the circuit layer. The capacitor further includes an insulator surrounding the first conductor.

20 Claims, 14 Drawing Sheets

(56) References Cited

U.S. PATENT DOCUMENTS

2011/0254074 A1\* 10/2011 Anezaki ............ H01L 29/40114
                                                                257/E27.103
2013/0043560 A1    2/2013  Tzeng
2013/0062679 A1    3/2013  Manabe \* cited by examiner

SEMICONDUCTOR DEVICE INCLUDING METAL INSULATOR METAL CAPACITOR AND METHOD OF MAKING

RELATED APPLICATION

This application is a continuation of U.S. application Ser. No. 16/780,686, filed Feb. 3, 2020, which is a divisional of U.S. application Ser. No. 14/103,651, filed Dec. 11, 2013, now U.S. Pat. No. 10,553,672, issued Feb. 4, 2020, the entire contents of which are hereby incorporated by reference.

BACKGROUND

Metal-insulator-metal (MIM) capacitors can be used in various integrated circuits such as analog frequency tuning circuits, switched capacitor circuits, filters, resonators, up-conversion and down-conversion mixers, and A/D converters. A conventional MIM capacitor includes a top metal layer, an insulator layer and a bottom metal layer, in which the top metal layer, the insulator layer and the bottom metal layer are vertically stacked on a semiconductor substrate and occupy quite a large surface area of the semiconductor substrate, and thus the capacitance of the conventional MIM capacitor is restricted by the limited area of the semiconductor substrate, and a device formed thereby will be constrained due to chip design rules. The conventional MIN capacitor requires many masks, and has a complicated manufacturing process.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
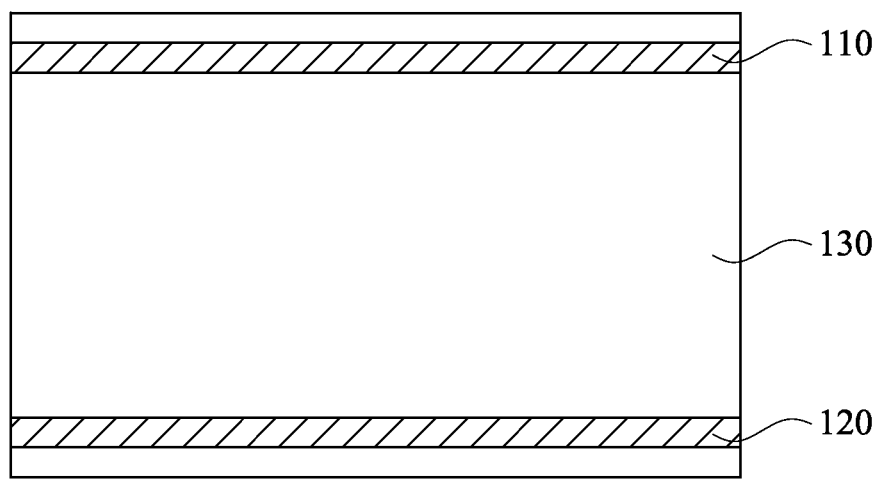
FIG. 1A and FIG. 1B are respective schematic top and side views showing a MIM capacitor according to various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specific It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Embodiments of the present disclosure are directed to structures of Metal-insulator-metal (MIM) capacitors and methods for forming the MIM capacitors. In various embodiments, a MIM capacitor includes two conductors disposed upright on a semiconductor substrate and an insulator disposed between the conductors, and thus the method for forming the MIM capacitor is simplified and cost effective.

Figure 1B:
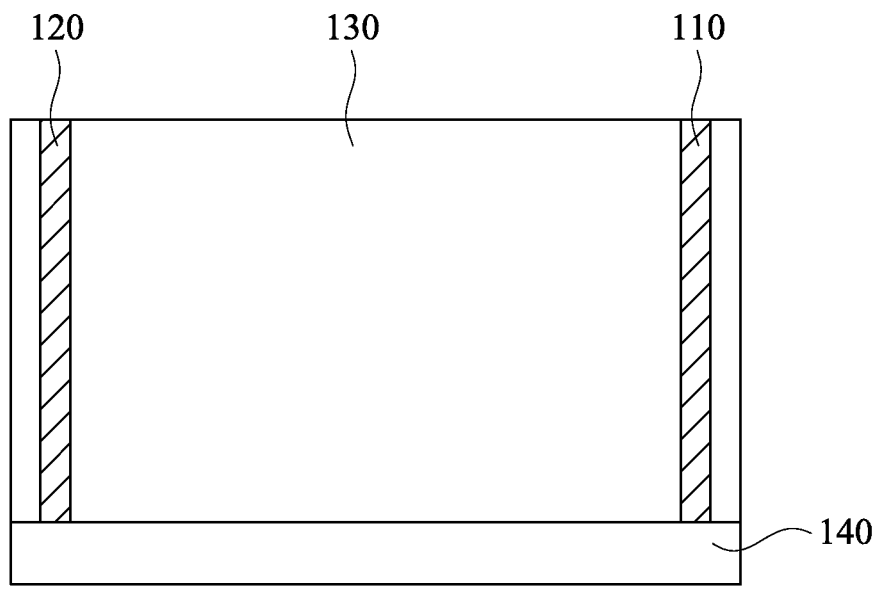

FIG. 1A and FIG. 1B are respective schematic top and side views showing a MIM capacitor 100 according to various embodiments. The MIM capacitor 100 includes a first conductor 110, a second conductor 120, an insulator 130, and a semiconductor substrate 140. The first conductor 110, the second conductor 120 and the insulator 130 are disposed vertically on the semiconductor substrate 140, and the insulator 130 is disposed between the first conductor 110 and the second conductor 120 to insulate the first conductor 110 from the second conductor 120. The first conductor 110 and the second conductor 120 are disposed upright on the semiconductor substrate 140 to be used as electrodes of the MIM capacitor 100. Since the MIM capacitor 100 is vertically disposed on the semiconductor substrate 120, the surface area occupied by the MIM capacitor 100 is relatively small. Thus, the capacitance of the conventional MIM capacitor 100 can be relatively large, and there is more space to design a device formed thereby.

The semiconductor substrate 140 is defined as any construction including semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The material of the first conductor 110 and the second conductor 120 includes, but is not limited to aluminum (Al), copper (Cu), silver (Ag), gold (Au), nickel (Ni), tungsten (W), or an alloy thereof. The material of the insulator 130 includes, but is not limited to aluminum oxide (Al2O3), hafnium oxide (HfO2), silicon carbide (SiC), silicon nitride, tantalum oxide (Ta2O5), tantalum oxynitride, titanium oxide, lead zirconate titanate (PZT), strontium bismuth tantalite (SBT), bismuth strontium tantalite (BST), strontium tantalite (ST), magnesium oxide, calcium oxide, hafnium silicon oxide, hafnium silicon oxynitride, zirconium oxide, yttrium oxide, strontium oxide, lanthanum oxide, barium oxide, or combinations thereof.

Referring to FIG. 2A-FIG. 2H, FIG. 2A, FIG. 2C, FIG. 2E and FIG. 2G are schematic top views of intermediate stages according to a method for forming a MIM capacitor in some embodiments, and FIG. 2B, FIG. 2D, FIG. 2F and FIG. 2H are schematic cross-sectional views of intermediate stages according to the method for forming the MIM capacitor in some embodiments.

Figure 2A:
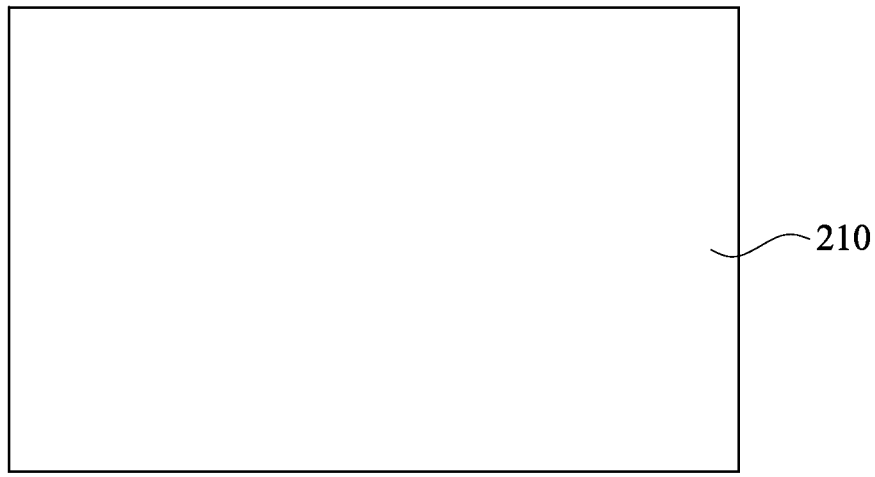
FIG. 2A, FIG. 2C, FIG. 2E and FIG. 2G are schematic top views of intermediate stages according to a method for forming a MIM capacitor in some embodiments.
Figure 2B:
FIG. 2B, FIG. 2D, FIG. 2F and FIG. 2H are schematic cross-sectional views of intermediate stages according to the method for forming the MIM capacitor in some embodiments.
Figure 2C:
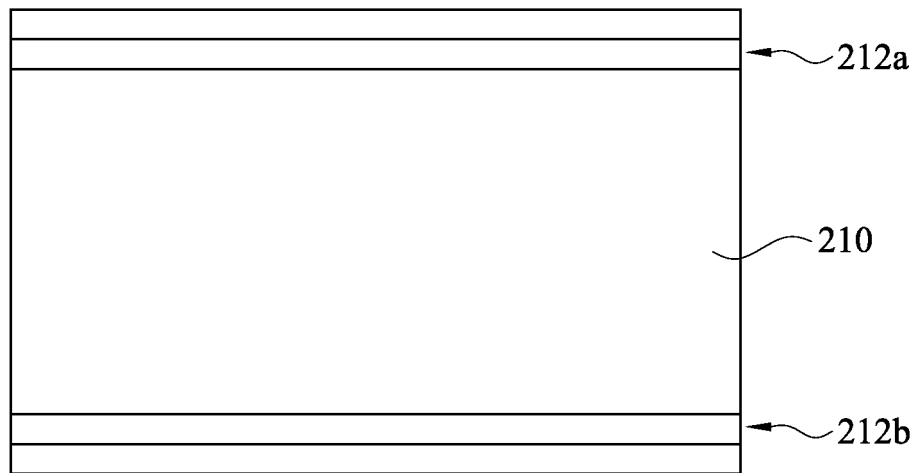
Figure 2D:
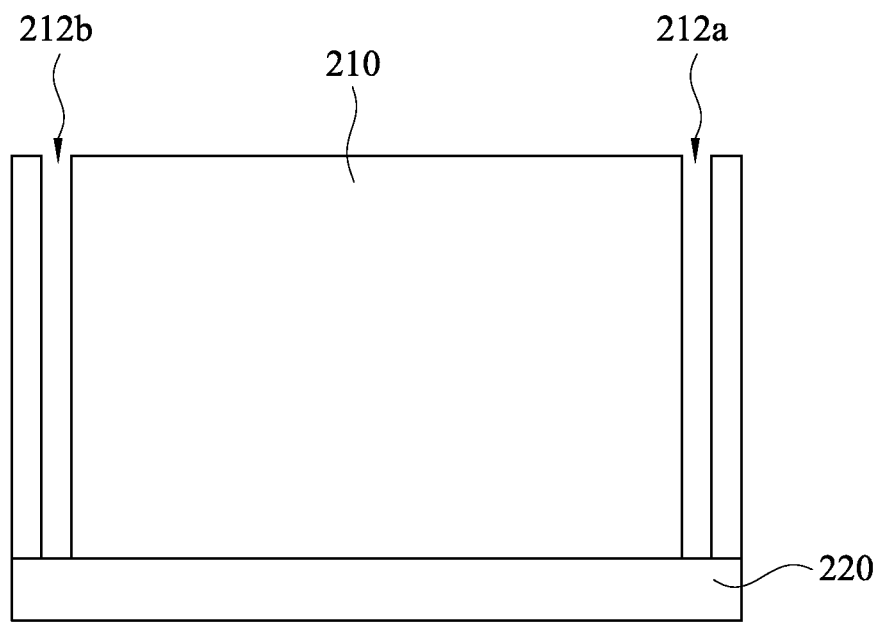

As shown in FIG. 2A and FIG. 2B, an insulator 210 is formed on a semiconductor substrate 220. The methods for forming the insulator 210 include, but not limit to a chemical vapor deposition (CVD) process and a physical vapor deposition (PVD) process. As shown in FIG. 2C and FIG. 2D, the insulator 210 is patterned to form a first trench 212 *a* and a second trench 212 *b* in the insulator 210. In some embodiments, the first trench 212 *a* and the second trench 212 *b* are vertical to the substrate 220 and are parallel to each other. The method for patterning the insulator 210 includes a photolithographic process.

Figure 2E:
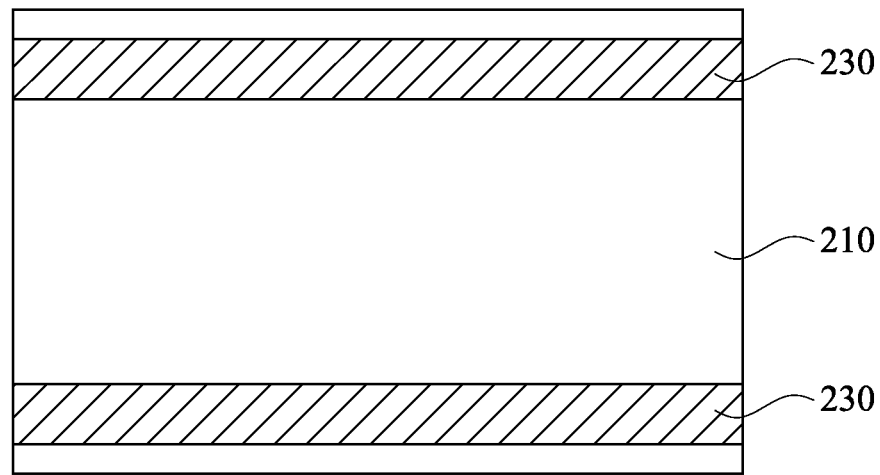
Figure 2F:
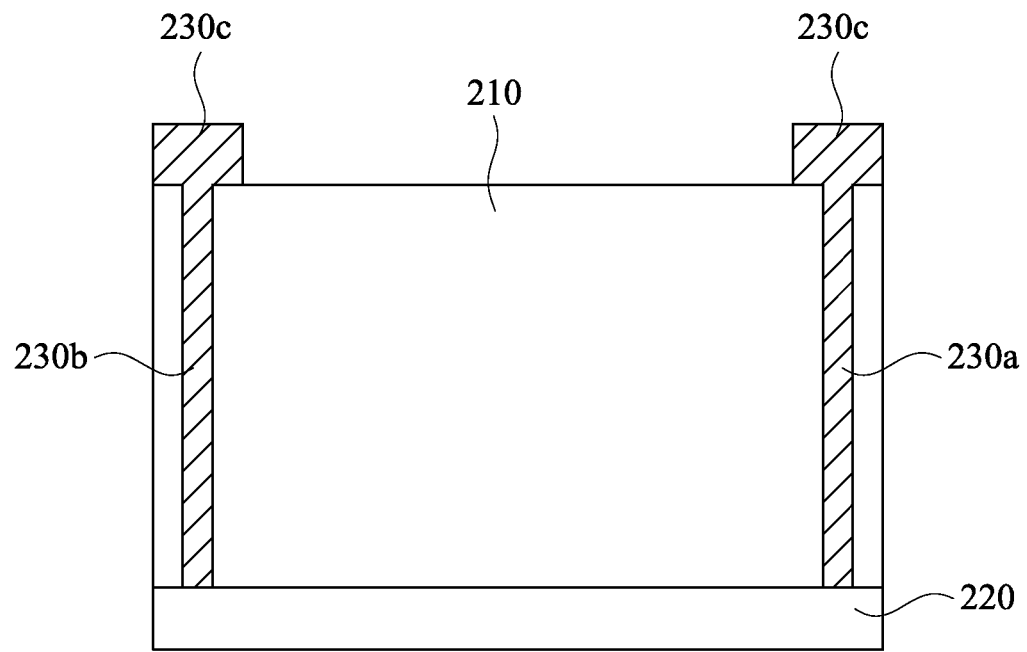
Figure 2G:
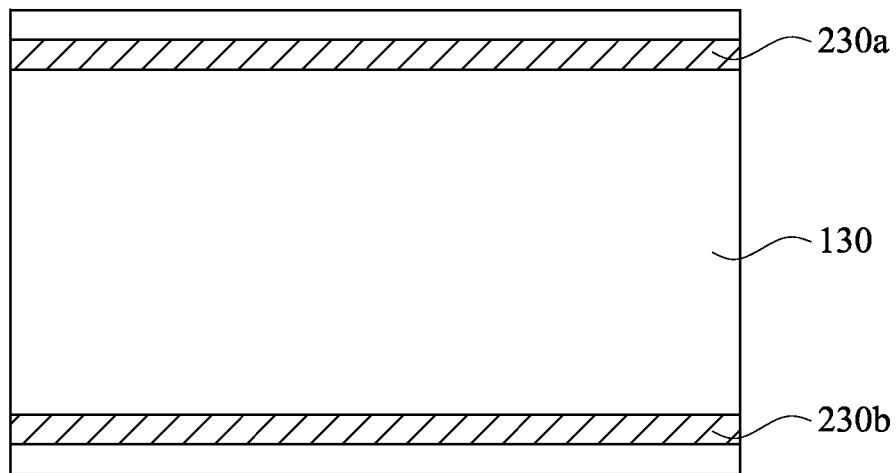
Figure 2H:
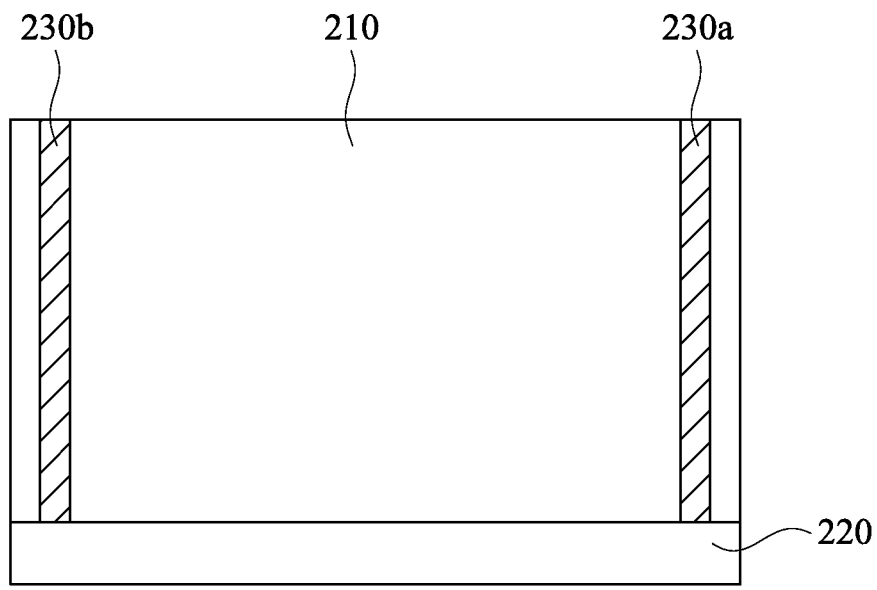

As shown in FIG. 2E and FIG. 2F, a conductor material 230 fills the first trench 212 *a* and the second trench 212 *b* to form a first conductor 230 *a* and a second conductor 230 *b* used as electrodes of a MIM capacitor. Since the first trench 212 *a* and the second trench 212 *b* are vertical to the substrate 220 and are parallel to each other, the first conductor 230 *a* and the second conductor 230 *b* therein are also vertical to the substrate 220 and are parallel to each other. The methods for filling the first trench 212 *a* and the second trench 212 *b* include, but not limited to a CVD process and a PVD process. In some embodiments, a portion 230 *c* of the conductor material 230 remains above a top of the insulator 210 after the operation for filling first trench 212 *a* and the second trench 212 *b* is performed. As shown in FIG. 2G and FIG. 2H, the portion 230 *c* of the conductor material 230 remaining above the top of the insulator 210 may be optionally removed, and a MIM capacitor 200 is formed accordingly. In some embodiments, the portion 230 *c* of the conductor material 230 may not be removed in the MIM capacitor. The method for removing the remaining portion 230 *c* includes, but not limited to a chemical mechanical polish (CMP) process.

Figure 3:
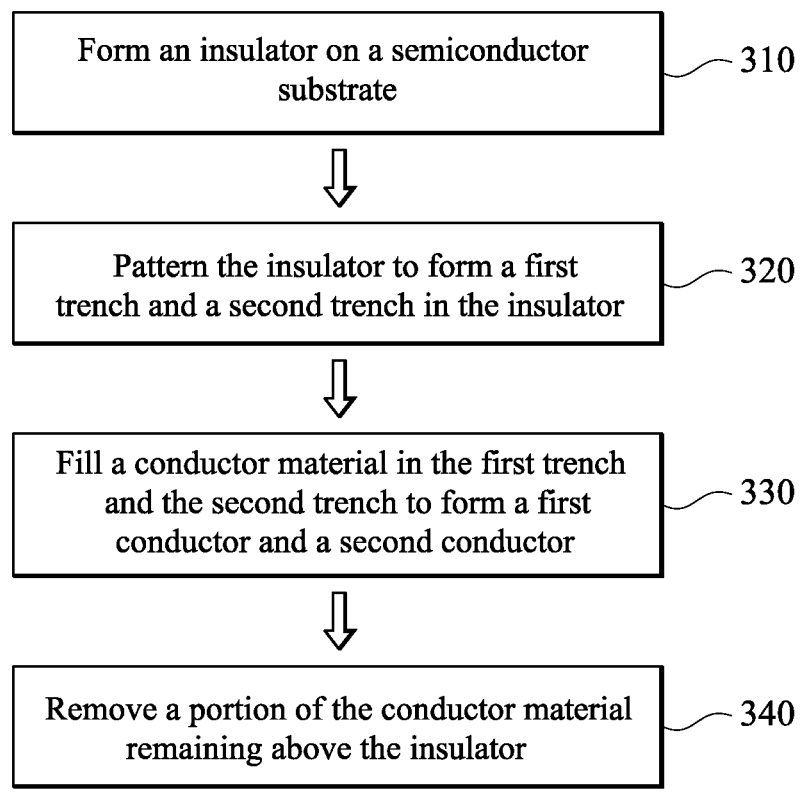
FIG. 3 is a flow chart of a method for fabricating a MIM capacitor in accordance with various embodiments.

Referring to FIG. 3 with FIG. 2A-FIG. 2H, FIG. 3 is a flow chart of a method 300 for fabricating a MIM capacitor in accordance with various embodiments. The method 300 begins at operation 310, where an insulator 210 is formed on a semiconductor substrate 220, as shown in FIG. 2A and FIG. 2B. At operation 320, the insulator 210 is patterned to form a first trench 212 *a* and a second trench 212 *b* in the insulator 210, as shown in FIG. 2C and FIG. 2D. At operation 330, a conductor material 230 fills the first trench 212 *a* and the second trench 212 *b* to form a first conductor 230 *a* and a second conductor 230 *b*, as shown in FIG. 2E and FIG. 2F. In some embodiments, operation 340 may be optionally performed to remove a portion 230 *c* of the conductor material 230 remaining above the insulator 210, as shown in FIG. 2G and FIG. 2H.

Comparing with the conventional method for fabricating a conventional MIM capacitor in which a top metal layer, an insulator layer and a bottom metal layer are vertically stacked on a semiconductor substrate, the method 300 needs fewer masks to fabricate the MIM capacitor 200, and thus the method 300 is cost effective.

Figure 4A:
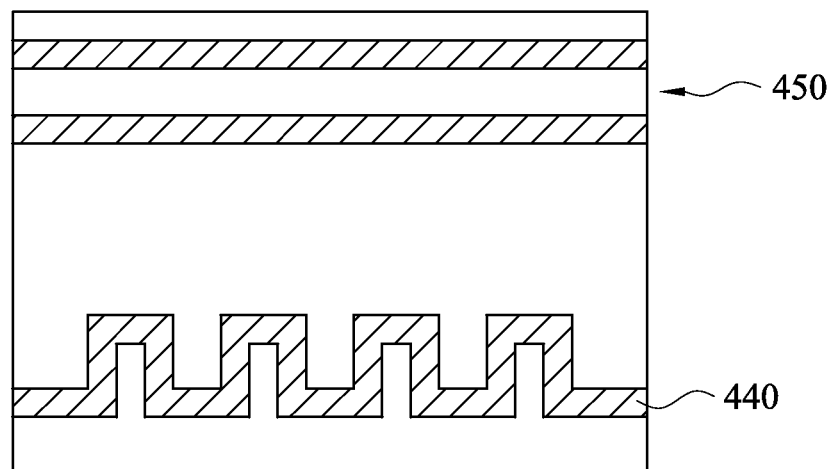
FIG. 4A and FIG. 4B are respective schematic top and side views showing a semiconductor device according to various embodiments.
Figure 4B:
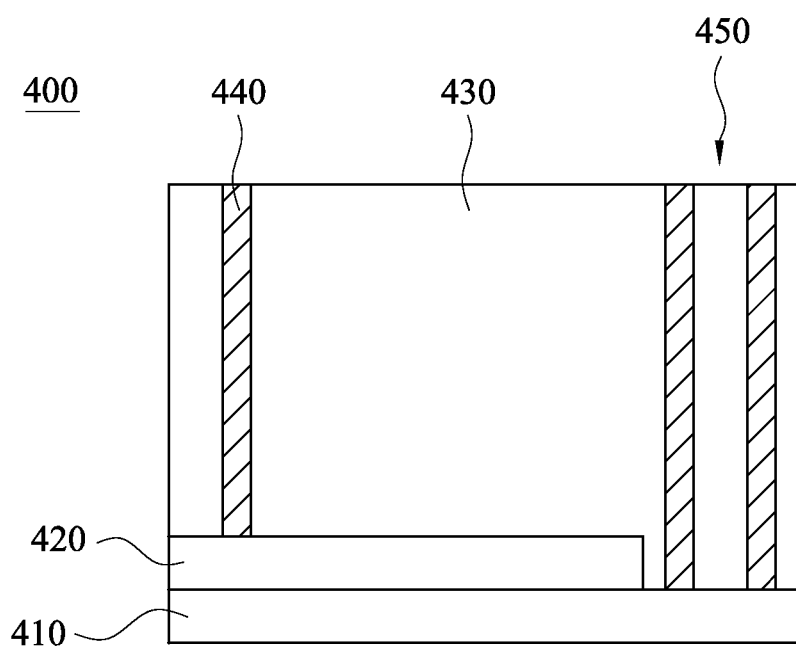

FIG. 4A and FIG. 4B are respective schematic top and side views showing a semiconductor device 400 according to various embodiments. The semiconductor device 400 includes a semiconductor substrate 410, a circuit layer 420, an insulator 430, a test line 440 and a MIM capacitor 450. The test line 440 can be disposed directly on the semiconductor substrate 410 to be electrically connected to the circuit layer 420. In some embodiments, via structures can be used to electrically connect the test line 440 with the circuit layer 420. The circuit layer 420 is horizontally disposed on the semiconductor substrate 410. The circuit layer 420 includes a circuit device using the MIM capacitor 450, such as a memory or other device. The MIM capacitor 450 is disposed on the substrate 410. In some embodiments, The MIM capacitor 450 can be directly disposed on the circuit layer 420.

Referring to FIG. 5A-FIG. 5H, FIG. 5A, FIG. 5C, FIG. 5E, FIG. 5G and FIG. 5I are schematic top views of intermediate stages according to a method for forming a semiconductor device 500 in some embodiments, and FIG. 5B, FIG. 5D, FIG. 5F, FIG. 5H and FIG. 5J are schematic cross-sectional views of intermediate stages according to the method for forming the semiconductor device 500 in some embodiments.

Figure 5A:
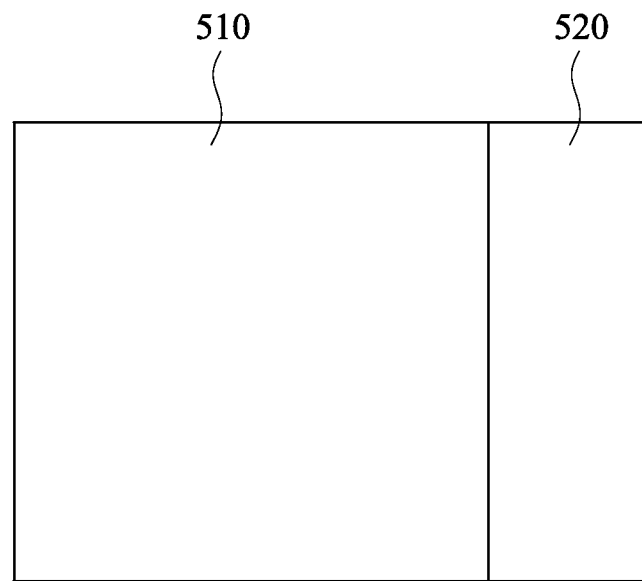
FIG. 5A, FIG. 5C, FIG. 5E, FIG. 5G and FIG. 5I are schematic top views of intermediate stages according to a method for forming a semiconductor device in some embodiments.
Figure 5B:
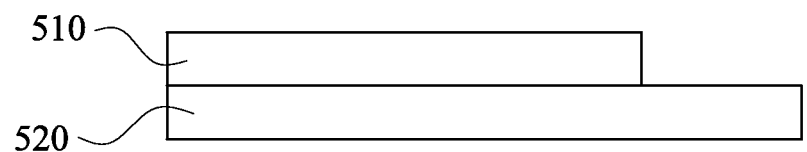
FIG. 5B, FIG. 5D, FIG. 5F, FIG. 5H and FIG. 5J are schematic cross-sectional views of intermediate stages according to the method for forming the semiconductor device in some embodiments.
Figure 5C:
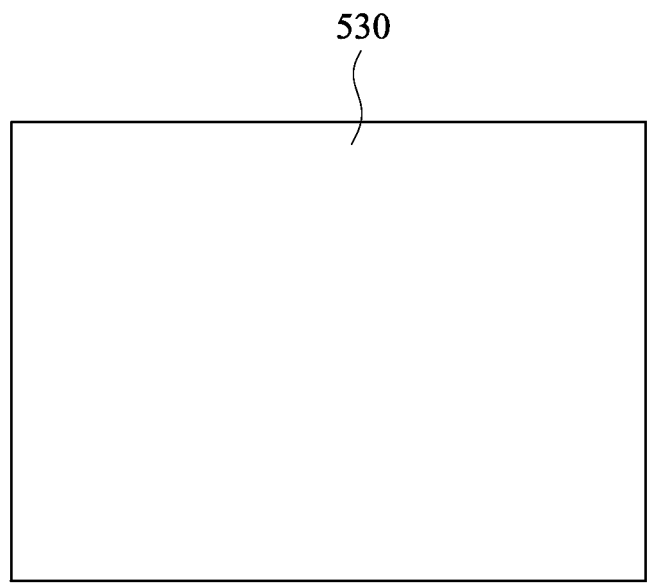
Figure 5D:
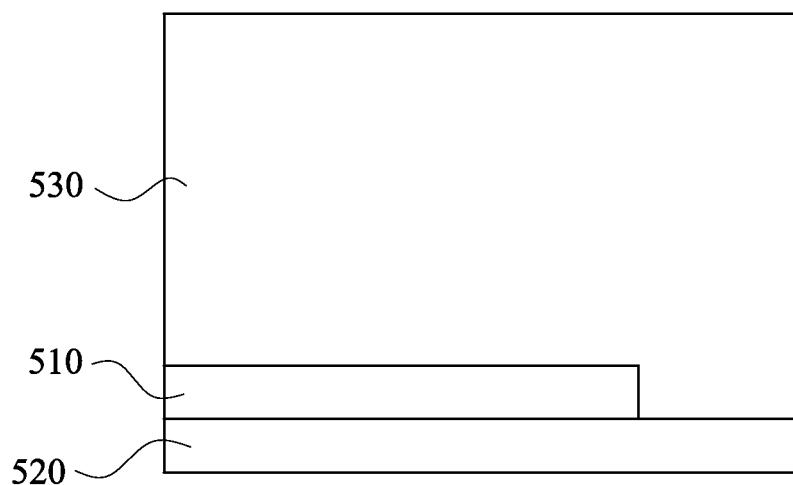
Figure 5E:
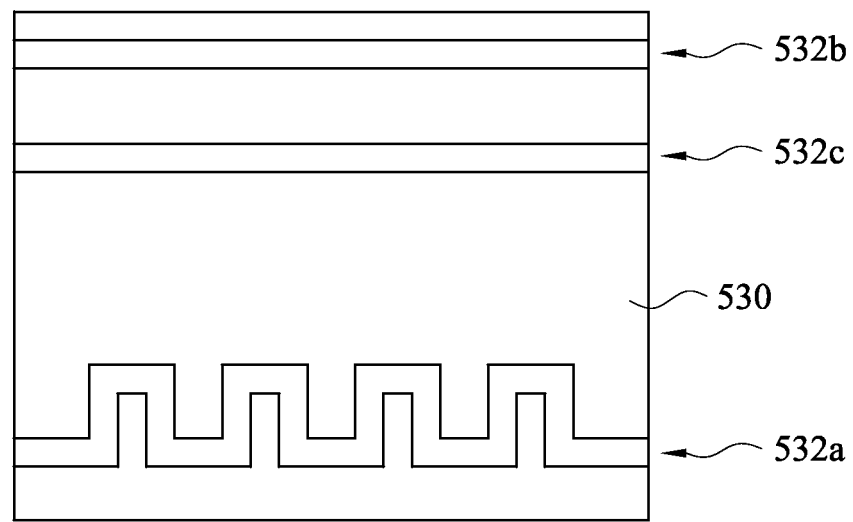
Figure 5F:
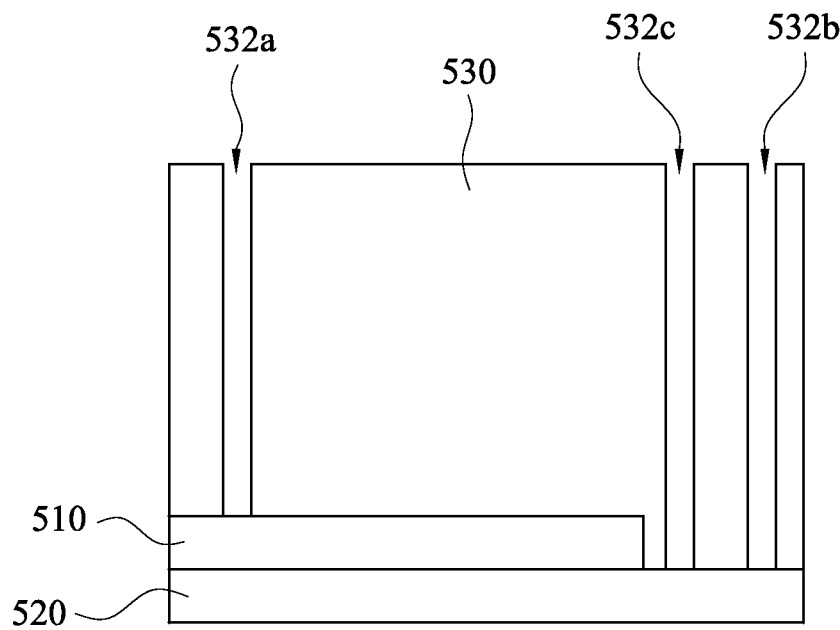

As shown in FIG. 5A and FIG. 5B, a circuit layer 510 is formed on a substrate 520. The circuit layer 510 includes a circuit device using a MIM capacitor, such as a memory or other device. As shown in FIG. 5C and FIG. 5D, an insulator 530 is formed on the circuit layer 510. As shown in FIG. 5E and FIG. 5F, the insulator 530 is patterned to form a test line trench 532 *a*, a first trench 532 *b* and a second trench 532 *c* in the insulator 530. In some embodiments, the first trench 532 *b* and the second trench 532 *c* are vertical to the substrate 520 and are parallel to each other. The methods for patterning the insulator 530 include a photolithographic process, and thus a mask including a test line pattern and a capacitor pattern with a first trench pattern and a second trench pattern are used in the photolithographic process.

Figure 5G:
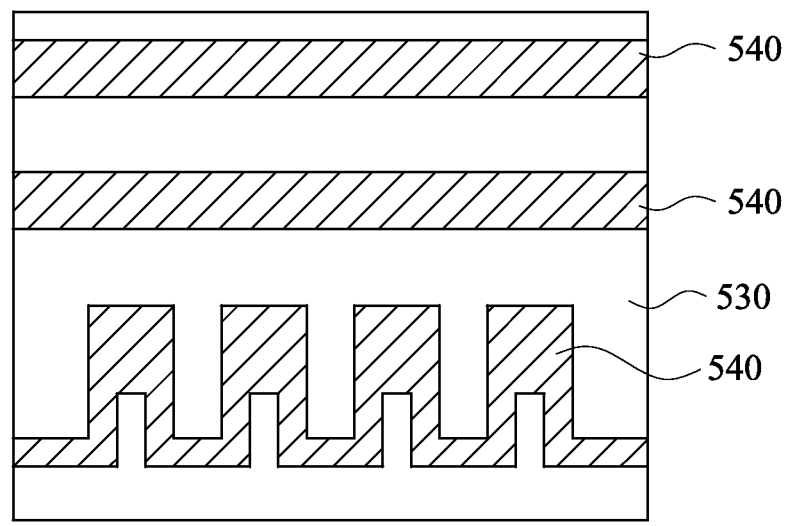
Figure 5H:
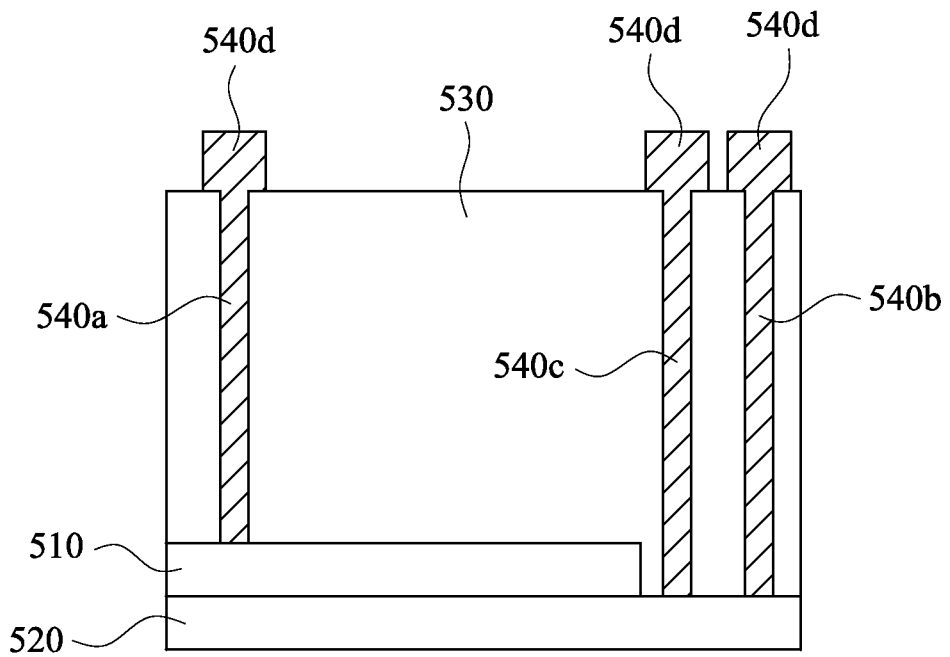
Figure 5I:
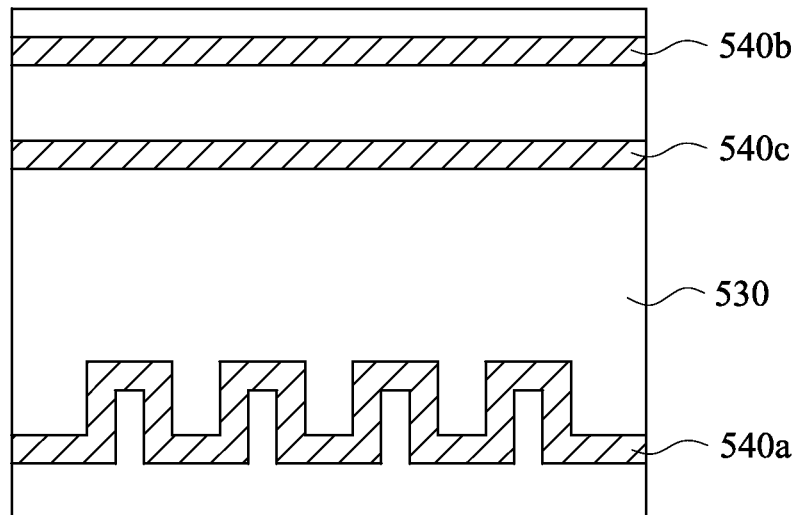
Figure 5J:
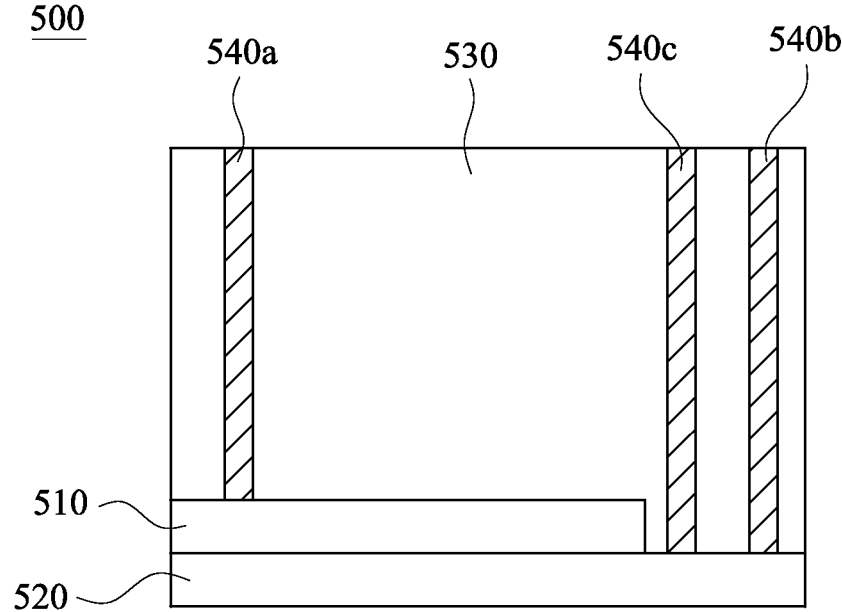

As shown in FIG. 5G and FIG. 5H, a conductor material 540 fills the test line trench 532 *a*, the first trench 532 *b* and the second trench 532 *c*, thereby forming a test line 540 *a*, a first conductor 540 *b* and a second conductor 540 *c*. The first conductor 540 *b* and the second conductor 540 *c* are used to be electrodes of a MIM capacitor. Since the first trench 532 *b* and the second trench 532 *c* are vertical to the substrate 520 and are parallel to each other, the first conductor 540 *b* and the second conductor 540 *c* therein are also vertical to the substrate 520 and are parallel to each other. In some embodiments, a portion 540 *d* of the conductor material 540 remains above a top of the insulator 530 after the operation for filling the test line trench 532 *a*, the first trench 532 *b* and the second trench 532 *c*. As shown in FIG. 5I and FIG. 5J, the portion 540 *d* of the conductor material 540 remaining above the insulator 530 is removed.

Figure 6:
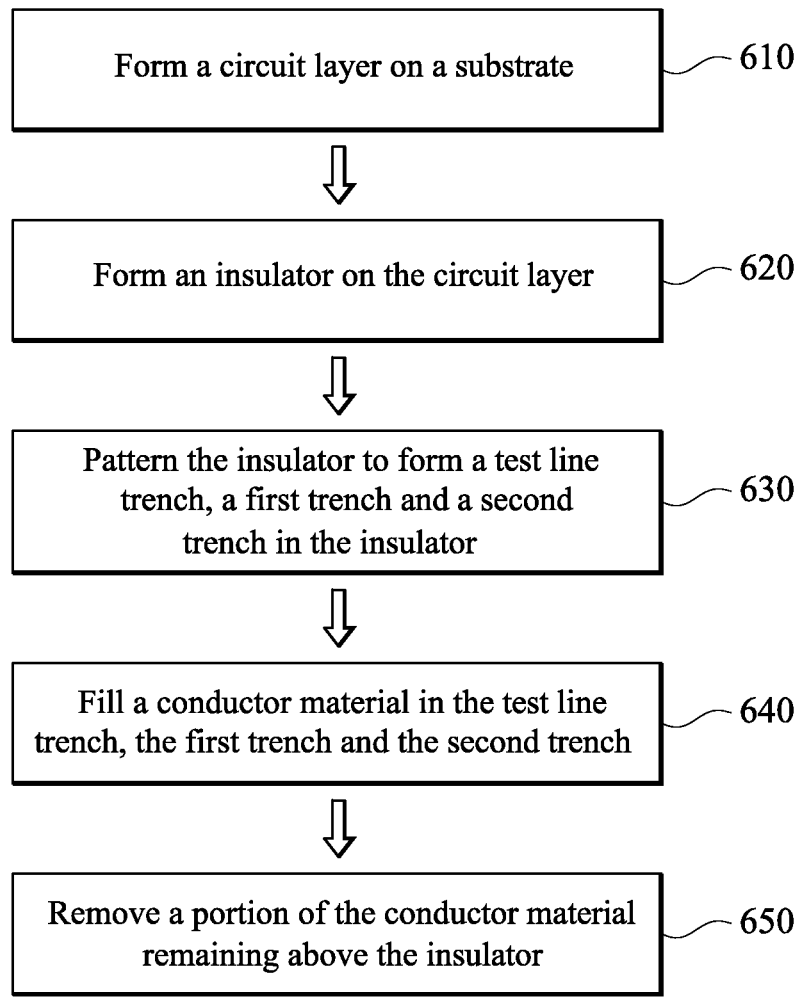
FIG. 6 is a flow chart of a method for fabricating a MIM capacitor in accordance with various embodiments.

Referring to FIG. 6 with FIG. 5A-FIG. 5J, FIG. 6 is a flow chart of a method 600 for fabricating a MIM capacitor in accordance with various embodiments. The method 600 begins at operation 610, where a circuit layer 510 is formed on a substrate 520. At operation 620, an insulator 530 is formed on the circuit layer 510, as shown in FIG. 5C and FIG. 5G. At operation 630, the insulator 530 is patterned to form a test line trench 532 *a*, a first trench 532 *b* and a second trench 532 *c* in the insulator 530, as shown in FIG. 5E and FIG. 5F.

At operation 640, a conductor material 540 fills the test line trench 532 *a*, the first trench 532 *b* and the second trench 532 *c*, thereby forming a test line 540 *a*, a first conductor 540 *b* and a second conductor 540 *c*, as shown in FIG. 5G and FIG. 5H. In some embodiments, a portion 540 *d* of the conductor material 540 remains above the insulator 530 after the operation for filling the test line trench 532 *a*, the first trench 532 *b* and the second trench 532 *c* is performed, and thus at operation 650, the portion 540 *d* of the conductor material 540 remaining above the top of the insulator 530 is removed, as shown in FIG. 5I and FIG. 5J. In some embodiments, the portion 540 *d* of the conductor material 540 may not be removed in the MIM capacitor.

Comparing with the conventional method for fabricating a conventional MIM capacitor in which a top metal layer, an insulator layer and a bottom metal layer are vertically stacked on a semiconductor substrate, the method 600 integrates a process forming a MIM capacitor and a process forming a test line together. For example, in the operation 630, patterns corresponding to the test line trench 532 *a*, the first trench 532 *b* and the second trench 532 *c* are formed one the same mask, thereby forming the test line trench 532 *a*, the first trench 532 *b* and the second trench 532 *c* in the insulator 530 simultaneously. For another example, in the operation 640, the test line 540 *a*, the first conductor 540 *b* and the second conductor 540 *c* are formed in the same process (a CVD process, a PVD process, or the like), thereby forming the test line 540 *a*, the first conductor 540 *b* and the second conductor 540 *c* in the insulator 530 simultaneously. Therefore, the method 600 needs fewer masks to fabricate the MIM capacitor 500, and thus the method 600 is cost effective.

Figure 7A:
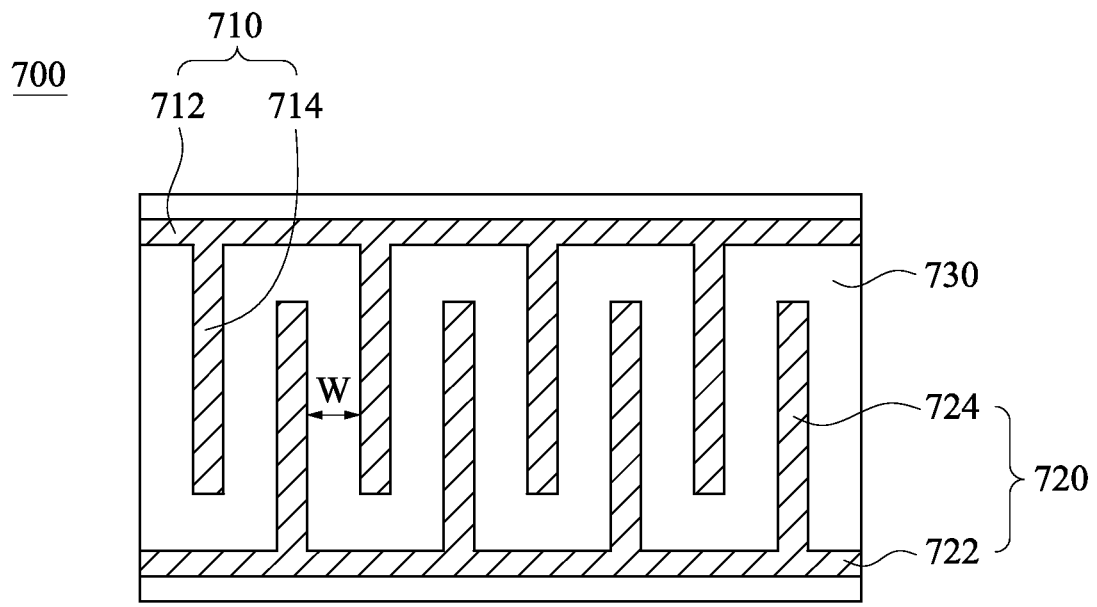
FIG. 7A and FIG. 7B are respective schematic top and side views showing a MIM capacitor according to various embodiments.
Figure 7B:
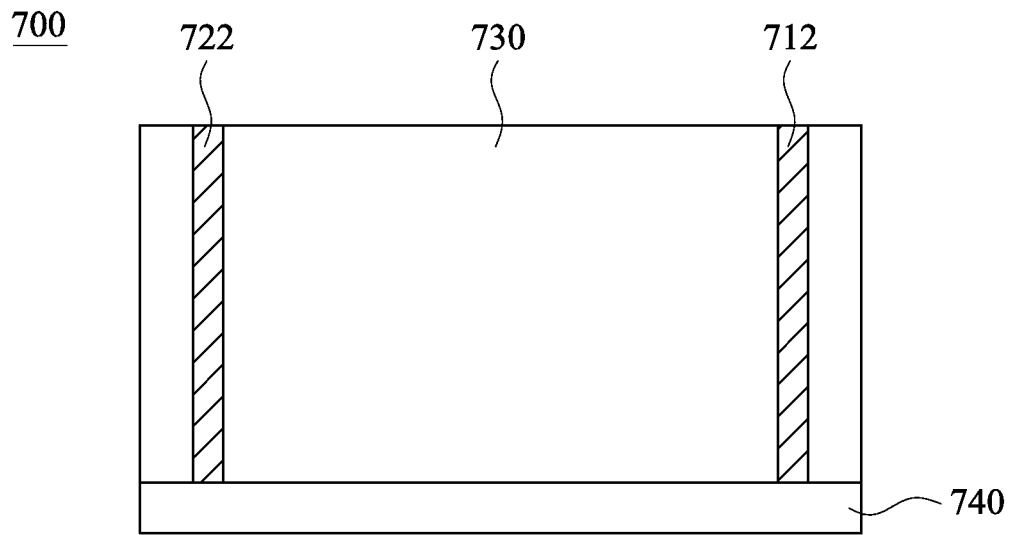

FIG. 7A and FIG. 7B are respective schematic top and side views showing a MIM capacitor 700 according to various embodiments. The MIM capacitor 700 includes a first conductor 710, a second conductor 720, an insulator 730, and a semiconductor substrate 740. The first conductor 710, the second conductor 720 and the insulator 730 are disposed vertically on the semiconductor substrate 740, and the insulator 730 is disposed between the first conductor 710 and the second conductor 720 to insulate the first conductor 710 from the second conductor 720. The first conductor 710 and the second conductor 720 are disposed upright on the semiconductor substrate 740 to be used as electrodes of the MIM capacitor 700. The first conductor 710 includes a main portion 712 and branch portions 714. Similarly, the second conductor 720 includes a main portion 722 and branch portions 724. In some embodiments, the main portion 712 is vertical to the branch portions 714, and the main portion 722 is vertical to the branch portions 724.

The main portion 712 of the first conductor 710 is parallel to the main portion 722 of the second conductor 720, and the branch portions 714 of the first conductor 710 is parallel to the branch portions 724 of the second conductor 720, in which a capacitance of the MIM capacitor 700 is determined in accordance with a width W between the branch portion 714 and the branch portion 724.

In accordance with some embodiments, the present disclosure discloses a semiconductor device including a semiconductor substrate and a capacitor device disposed on the semiconductor substrate. The capacitor device includes a first conductor, a second conductor and an insulator. The first conductor and the second conductor are upright on the semiconductor substrate. The insulator is disposed between the first conductor and the second conductor on the semiconductor substrate for insulating the first conductor from the second conductor. The insulator has a first trench receiving the first conductor and a second trench receiving the second conductor.

In accordance with certain embodiments, the present disclosure disclosed a method for fabricating a semiconductor device. In this method, an insulator is formed on a semiconductor substrate. Then, at least two trenches are formed in the insulator. Thereafter, a conductor material fills the two trenches.

In accordance with certain embodiments, the present disclosure disclosed a method for fabricating a semiconductor device. In this method, a circuit layer is formed on a semiconductor substrate. Then, an insulator is formed on the circuit layer. Thereafter, a mask including a test line pattern and a capacitor pattern with a first trench pattern and a second trench pattern is provided. Then, a test line trench, a first trench and a second trench are formed in the insulator by using the mask. Thereafter, a conductor material fills the test line trench, the first trench and the second trench to form a test line conductor, a first conductor and a second conductor electrically connected to the circuit layer respectively.

Although the present invention has been described in considerable detail with reference to certain embodiments thereof, other embodiments are possible. Therefore, the spirit and scope of the appended claims should not be limited to the description of the embodiments contained herein.

An aspect of this description relates to a semiconductor device. The semiconductor device includes a substrate. The semiconductor device further includes a circuit layer over the substrate. The semiconductor device further includes a test line electrically connected to the circuit layer. The semiconductor device further includes a capacitor on the substrate. The capacitor includes a first conductor, wherein the first conductor is on a portion of the substrate exposed by the circuit layer. The capacitor further includes an insulator surrounding the first conductor. In some embodiments, the insulator further surrounds the test line. In some embodiments, the capacitor further includes a second conductor, and the insulator is between the first conductor and the second conductor. In some embodiments, the first conductor is between the circuit layer and the second conductor. In some embodiments, the second conductor is on the portion of the substrate exposed by the circuit layer. In some embodiments, the test line directly connects to the circuit layer. In some embodiments, the semiconductor device further includes a via electrically connecting the test line to the circuit layer. In some embodiments, the circuit layer is electrically connected to the capacitor. In some embodiments, the circuit layer includes a memory device electrically connected to the capacitor. In some embodiments, the test line has a serpentine shape.

An aspect of this description relates to a semiconductor device. The semiconductor device includes a substrate. The semiconductor device includes a circuit layer over the substrate. The semiconductor device further includes a test line electrically connected to the circuit layer. The semiconductor device further includes a capacitor, wherein an entirety of the capacitor is on a portion of the substrate exposed by the circuit layer. The capacitor includes a first conductor; a second conductor; and an insulator between the first conductor and the second conductor. In some embodiments, the circuit layer is electrically connected to the capacitor. In some embodiments, the insulator is between the capacitor and the test line. In some embodiments, a height of the first conductor from a top surface of the insulator to the substrate is greater than a height of the test line from the top surface of the insulator to the circuit layer. In some embodiments, the second conductor is between the first conductor and the circuit layer. In some embodiments, the test line includes a same material as at least one of the first conductor or the second conductor.

An aspect of this description relates to a method of making a semiconductor device. The method includes forming a circuit layer over a substrate. The method further includes depositing an insulator over the substrate. The method further includes patterning the insulator to define a test line trench, a first trench, and a second trench, wherein the first trench is on a portion of the substrate exposed by the circuit layer. The method further includes filling the test line trench to define a test line electrically connected to the circuit layer. The method further includes filling the first trench and the second trench to define a capacitor. In some embodiments, filling the test line trench includes filling the test line trench simultaneously with filling the first trench. In some embodiments, the method further includes electrically connecting the circuit layer to the capacitor. In some embodiments, filling the test line trench includes defining the test line in direct connection with the circuit layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   a circuit layer over the substrate;
   a test line electrically connected to the circuit layer; and
   a capacitor on the substrate, the capacitor comprising:
      a first conductor, wherein the first conductor is on a portion of the substrate exposed by the circuit layer; and
      an insulator surrounding the first conductor.

2. The semiconductor device of claim 1, wherein the insulator further surrounds the test line.

3. The semiconductor device of claim 1, wherein the capacitor further comprises a second conductor, and the insulator is between the first conductor and the second conductor.

4. The semiconductor device of claim 3, wherein the first conductor is between the circuit layer and the second conductor.

5. The semiconductor device of claim 3, wherein the second conductor is on the portion of the substrate exposed by the circuit layer.

6. The semiconductor device of claim 1, wherein the test line directly connects to the circuit layer.

7. The semiconductor device of claim 1, further comprising a via electrically connecting the test line to the circuit layer.

8. The semiconductor device of claim 1, wherein the circuit layer is electrically connected to the capacitor.

9. The semiconductor device of claim 8, wherein the circuit layer comprises a memory device electrically connected to the capacitor.

10. The semiconductor device of claim 1, wherein the test line has a serpentine shape.

11. A semiconductor device, comprising:
    a substrate;
    a circuit layer over the substrate;
    a test line electrically connected to the circuit layer; and
    a capacitor, wherein an entirety of the capacitor is on a portion of the substrate exposed by the circuit layer, the capacitor comprising:
       a first conductor;
       a second conductor; and
       an insulator between the first conductor and the second conductor.

12. The semiconductor device of claim 11, wherein the circuit layer is electrically connected to the capacitor.

13. The semiconductor device of claim 11, wherein the insulator is between the capacitor and the test line.

14. The semiconductor device of claim 11, wherein a height of the first conductor from a top surface of the insulator to the substrate is greater than a height of the test line from the top surface of the insulator to the circuit layer.

15. The semiconductor device of claim 11, wherein the second conductor is between the first conductor and the circuit layer.

16. The semiconductor device of claim 11, wherein the test line comprises a same material as at least one of the first conductor or the second conductor.

17. A semiconductor device, comprising:
    a substrate;
    a circuit layer over the substrate;
    a test line electrically connected to the circuit layer; and
    a capacitor on the substrate, the capacitor comprising:
       a first conductor, wherein the first conductor is on a first portion of the substrate exposed by the circuit layer;
       a second conductor, wherein the second conductor is on a second portion of the substrate exposed by the circuit layer; and
       an insulator between the first conductor and the second conductor.

18. The semiconductor device of claim 17, wherein the insulator is between the first conductor and the test line.

19. The semiconductor device of claim 17, wherein the insulator surrounds the first conductor and surrounds the second conductor.

20. The semiconductor device of claim 17, wherein a top-most surface of the test line is coplanar with a top-most surface of the insulator.

* * * * *